United States Patent
Davis et al.

(10) Patent No.: US 6,650,010 B2
(45) Date of Patent: Nov. 18, 2003

(54) UNIQUE FEATURE DESIGN ENABLING STRUCTURAL INTEGRITY FOR ADVANCED LOW K SEMICONDUCTOR CHIPS

(75) Inventors: Charles R. Davis, Fishkill, NY (US); David L. Hawken, Vestal, NY (US); Dae Young Jung, LaGrangeville, NY (US); William F. Landers, Wappingers Falls, NY (US); David L. Questad, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/078,174

(22) Filed: Feb. 15, 2002

(65) Prior Publication Data

US 2003/0155642 A1 Aug. 21, 2003

(51) Int. Cl.[7] .................................................. H01L 23/12
(52) U.S. Cl. ...................... 257/700; 257/701; 257/774; 257/758; 257/759
(58) Field of Search ................................ 257/690, 700, 257/701, 774, 758, 759, 786, 762

(56) References Cited

U.S. PATENT DOCUMENTS

| | | | |
|---|---|---|---|
| 5,563,443 A | | 10/1996 | Beng et al. |
| 5,736,791 A | | 4/1998 | Fujiki et al. |
| 5,763,936 A | | 6/1998 | Yamaha et al. |
| 5,801,445 A | | 9/1998 | Ishihara et al. |
| 5,885,857 A | | 3/1999 | Yamaha et al. |
| 5,901,050 A | * | 5/1999 | Imai .......................... 361/820 |
| 5,939,789 A | * | 8/1999 | Kawai et al. ................ 257/758 |
| 6,163,075 A | | 12/2000 | Okushima |
| 6,180,430 B1 | * | 1/2001 | Kong et al. .................... 438/30 |
| 6,313,537 B1 | * | 11/2001 | Lee et al. ..................... 257/758 |
| 6,417,533 B2 | * | 7/2002 | Kawata et al. ............... 257/296 |
| 6,548,400 B2 | * | 4/2003 | Brennan et al. ............. 438/637 |
| 2001/0000928 A1 | | 5/2001 | Lee et al. |
| 2001/0002323 A1 | | 5/2001 | Kobayashi et al. |
| 2002/0038903 A1 | * | 4/2002 | Tsau .......................... 257/532 |
| 2002/0053740 A1 | * | 5/2002 | Stamper et al. .............. 257/758 |
| 2002/0149083 A1 | * | 10/2002 | Kawata et al. ............... 257/516 |
| 2003/0001272 A1 | * | 1/2003 | Brennan et al. ............. 257/760 |

FOREIGN PATENT DOCUMENTS

| | | |
|---|---|---|
| EP | 0635891 A1 | 1/1995 |
| JP | 59169153 A | 9/1984 |
| JP | 62287645 A | 12/1987 |
| JP | 5039376 | 2/1993 |
| JP | 5299419 A | 11/1993 |
| JP | 8181127 A | 7/1996 |
| JP | 9298196 A | 11/1997 |

\* cited by examiner

*Primary Examiner*—Nathan J. Flynn
*Assistant Examiner*—Pershelle Greene
(74) *Attorney, Agent, or Firm*—Margaret A. Pepper; John A. Jordan

(57) ABSTRACT

A mesh-like reinforcing structure to inhibit delamination and cracking is fabricated in a multilayer semiconductor device using low-k dielectric materials and copper-based metallurgy. The mesh-like interconnection structure comprises conductive pads interconnected by conductive lines at each wiring level with each pad conductively connected to its adjacent pad at the next wiring level by a plurality of conductive vias. The conductive pads, lines and vias are fabricated during the normal BEOL wiring level integration process. The reinforcing structure provides both vertical and horizontal reinforcement and may be fabricated on the periphery of the active device region or within open regions of the device that are susceptible to delamination and cracking.

13 Claims, 7 Drawing Sheets

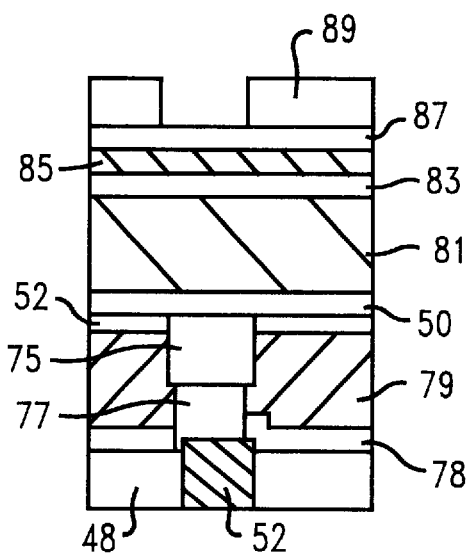
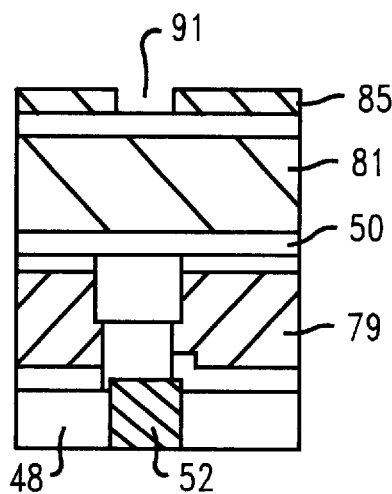
FIG. 6A  FIG. 6B
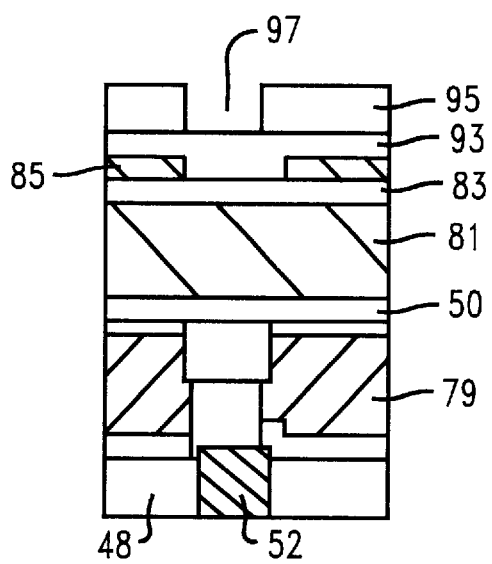
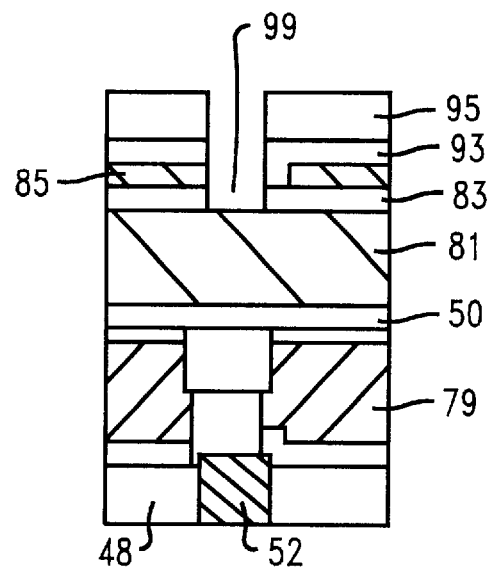
FIG. 6C  FIG. 6D

UNIQUE FEATURE DESIGN ENABLING STRUCTURAL INTEGRITY FOR ADVANCED LOW K SEMICONDUCTOR CHIPS

BACKGROUND OF THE INVENTION

1. Field of the Invention

The present invention relates to a multilayer wiring arrangement and, more particularly, to a multilayer semiconductor structure and method of forming said structure which acts to suppress delamination and cracking of low dielectric constant interlayer insulating materials.

2. Background and Related Art

With the fabrication of semiconductor devices, increased speed, density and design complexity requirements have necessitated forming multilayer wiring structures on the surface of the semiconductor substrate in order to effectively interconnect the various electrical elements of the semiconductor device. In a multilayer wiring structure, a plurality of wiring level layers are separated by interlayer insulating films, and the interconnection of the respective wiring level layers is achieved by conductive members formed in vias in the interlayer insulating films. This wiring level integration of a manufacturing process is known as the back-end-of-line (BEOL).

The BEOL of a typical semiconductor manufacturing process uses inorganic oxide dielectric materials as the intralayer and interlayer insulating films between the wiring level conductors and via conductors. Typical dielectric materials used in the industry for such purpose are silicon dioxide, silica glass, and fluorinated silica glass. These are normally deposited either by chemical vapor deposition (CVD) or spin on glass (SOG) processes.

With increasing demand for higher speed and more dense semiconductor devices, fabrication techniques have required the use of organic dielectric materials as the interlayer insulating film. These organic dielectric materials have a lower dielectric constant (k) than inorganic dielectric materials. Low-k dielectric materials are usually applied by a spin coating process. The physical properties of low-k materials are quite different from those typically exhibited by inorganic oxide dielectric materials. For example, low-k dielectric materials have approximately an order of magnitude lower modulus of elasticity. Thus, a typical low-k material, such as SiLK™, has a modulus of elasticity of 2.7 MPa while $SiO_2$ has a modulus of elasticity of 72 MPa. Likewise, there is greater than an order of magnitude difference in hardness with SiLK™ exhibiting a hardness of 0.25 GPA and $SiO_2$ exhibiting a hardness of 8.7 GPA. Similarly, coefficients of thermal expansion (CTE) are markedly different with SiLK™ having a CTE of $50 \times 10^{-6}$ per degrees C and $SiO_2$ having a CTE of $3 \times 10^{-6}$ per degrees C.

As a result of these different properties, the BEOL wiring level integration process using low-k dielectric material is much more complex than that typically employed using inorganic dielectric materials. For example, a thin layer of hard material such as, silicon dioxide or silicon nitride is needed over a low-k dielectric material to make the low-k material compatible with chemical mechanical polishing (CMP) processes.

The use of low-k polymeric dielectric materials thus has thus created new problems over what was known in using inorganic dielectric materials. For example, low-k organic materials have substantially lower bond strength to the other materials employed in multilayered BEOL wiring structure as compared to traditional oxide dielectric materials.

In this regard, since oxide dielectric materials form a very strong interfacial bond, semiconductor chips based upon oxide dielectric materials are fairly resistant against mechanical and thermal stresses applied to the chip during the manufacturing process or reliability testing.

The lower bond strength at the interfaces associated with low-k dielectric materials increases the likelihood of delamination at the interfaces during BEOL processing, thermal cycling or other stress testing operations than what has traditionally occurred. This delamination may then cause cracking of the wiring layer of a semiconductor chip. For example, a small delamination at the edge of a device produced by the dicing process will propagate toward the center of the chip and, over time, cause device failure. Since the risk of delamination increases with the increased number of BEOL wiring levels, advanced devices with increased number of wiring levels are more prone to this critical problem.

In addition to mechanically induced stresses, such as, handling and dicing, similar stresses are also produced when using low-k dielectric materials in semiconductor devices due to the interfacial stress caused by the differences in modulus of elasticity and TCE when the device is exposed to variations in temperature. In this regard, the magnitude of the stress is not only a function of the TCE and modulus of silicon, but is also a function of the low-k dielectric material, the hard mask material, the metal conductor material, passivation material, packaging material, and the thickness and volume fraction of each material in the structure.

SUMMARY OF THE PRESENT INVENTION

Accordingly, it is an object of the present invention to provide improved semiconductor device structure.

It is a further object of the present invention to provide a multilayer semiconductor device reinforcement structure and a method of making the same structure which structure inhibits delamination of the layers.

It is yet a further object of the present invention to provide an improved multilayer semiconductor device method and structure which allows the use of low-k organic dielectric material between layers of copper-based metallurgy with minimal delamination of layers and cracking of metallurgy.

It is still yet a further object of the present invention to provide an improved multilayer semiconductor structure using low-k dielectrical materials wherein a network or mesh of interconnected conductive lines and vias are employed around at least the periphery of the semiconductor device to thus anchor the complete BEOL fabricated multilayer structure and thereby inhibit delamination and cracking.

It is yet another object of the present invention to provide a multilayer semiconductor device with a mesh-like reinforcing structure electrically isolated from the active devices which structure mechanically ties together layers of low-k insulating films separating copper-based layers of metal and vias and is formed at the same time as BEOL processing.

In accordance with the present invention, there is provided a mesh-like reinforcing structure to improve the structural integrity of a multilayer semiconductor structure using low-k dielectric materials and copper-based metallurgy. The mesh-like interconnection structure comprises conductive pads interconnected by conductive lines at each wiring level with each pad conductively connected to its adjacent pad at the next wiring level by a plurality of conductive vias. The structure is such as to anchor the entire BEOL active device wiring integration metallization pattern and is formed during the normal BEOL device wiring level integration process. The mesh-like reinforcing structure may be fabricated on the periphery of the device, such as a chip, or within any open region of the device which may require anchoring to prevent delamination.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
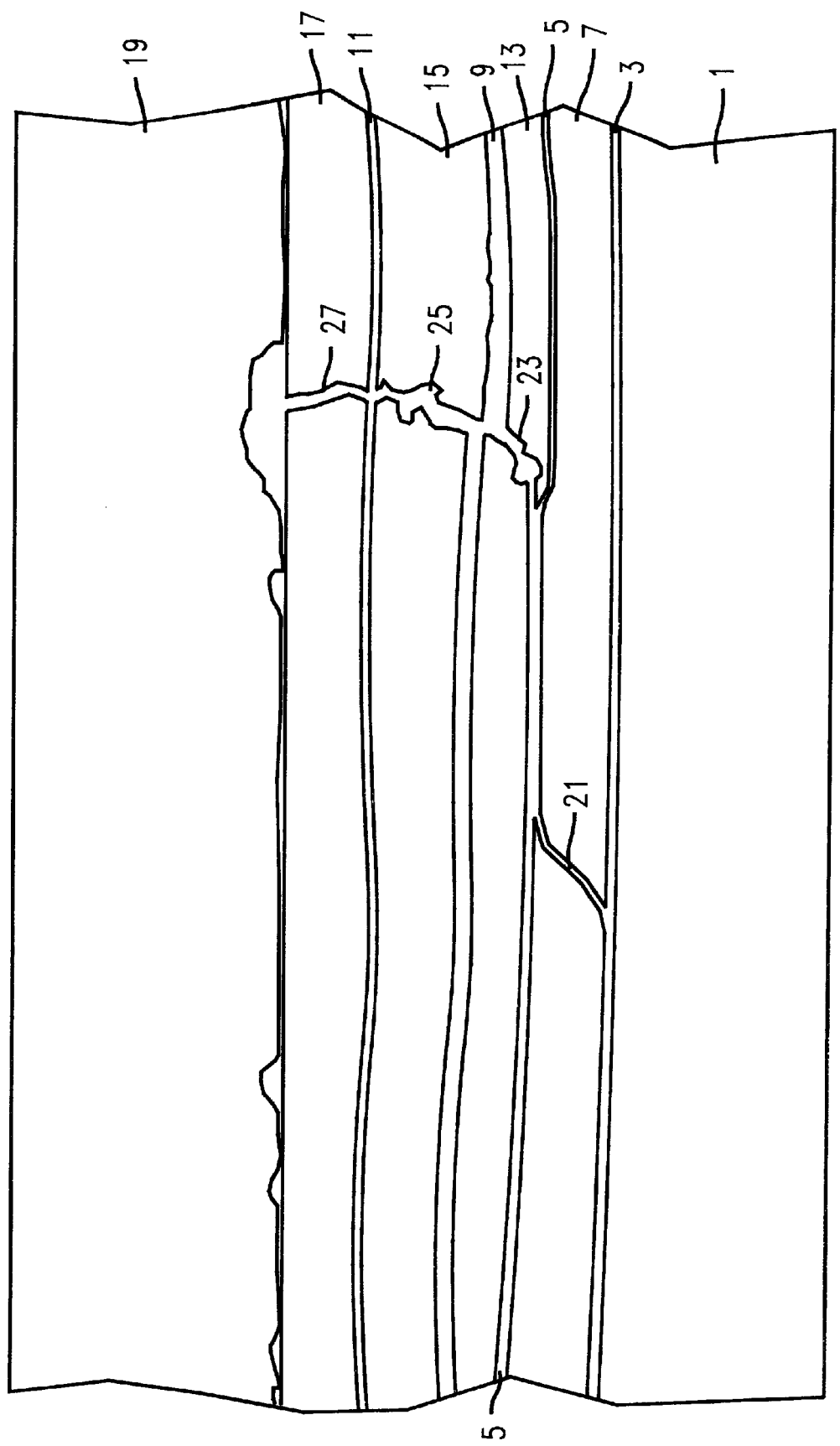
FIG. 1 shows a diagrammed sketch of a photograph showing delamination and cracking in a device using low-k dielectric material.

In the diagrammed sketch of a photograph showing delamination and cracking of FIG. 1, substrate 1, such as silicon, is shown supporting a multilayer wiring structure with layers of insulating material, including a low-k dielectric insulating material and copper metallurgy therebetween. Substrate I includes active components covered by an inorganic insulating material. Metal lines 3 and 5, such as copper lines, are separated by a layer of low-k dielectric material, such as SiLK™. Similarly, metal lines 5 and 9 are separated by a layer of low-k dielectric material 13. In like manner, metal lines 9 and 11 are separated by a layer of low-k material 15. Layer 17 is an oxide dielectric material covered with passivation layer 19.

As further shown in FIG. 1, a series of cracks 21, 23, 25 and 27 have occurred due to any of a variety of stress factors, such as, the stresses caused by thermal cycling. Since the CTE of low-k dielectric material is significantly different than that of silicon and its oxides, thermal cycling causes a different expansion rates at the interfaces to thereby induce stresses therein. Similarly, the lower modulus of elasticity, toughness and adhesion characteristics of low-k dielectric materials tends to compound the problem. As seen in FIG. 1, crack 21 extends through low-k dielectric insulating material 7 and is a result of delamination of such material in the vicinity of the crack. Similar delamination of insulating materials has occurred in the vicinity of cracks 23, 25 and 27.

Figure 2:
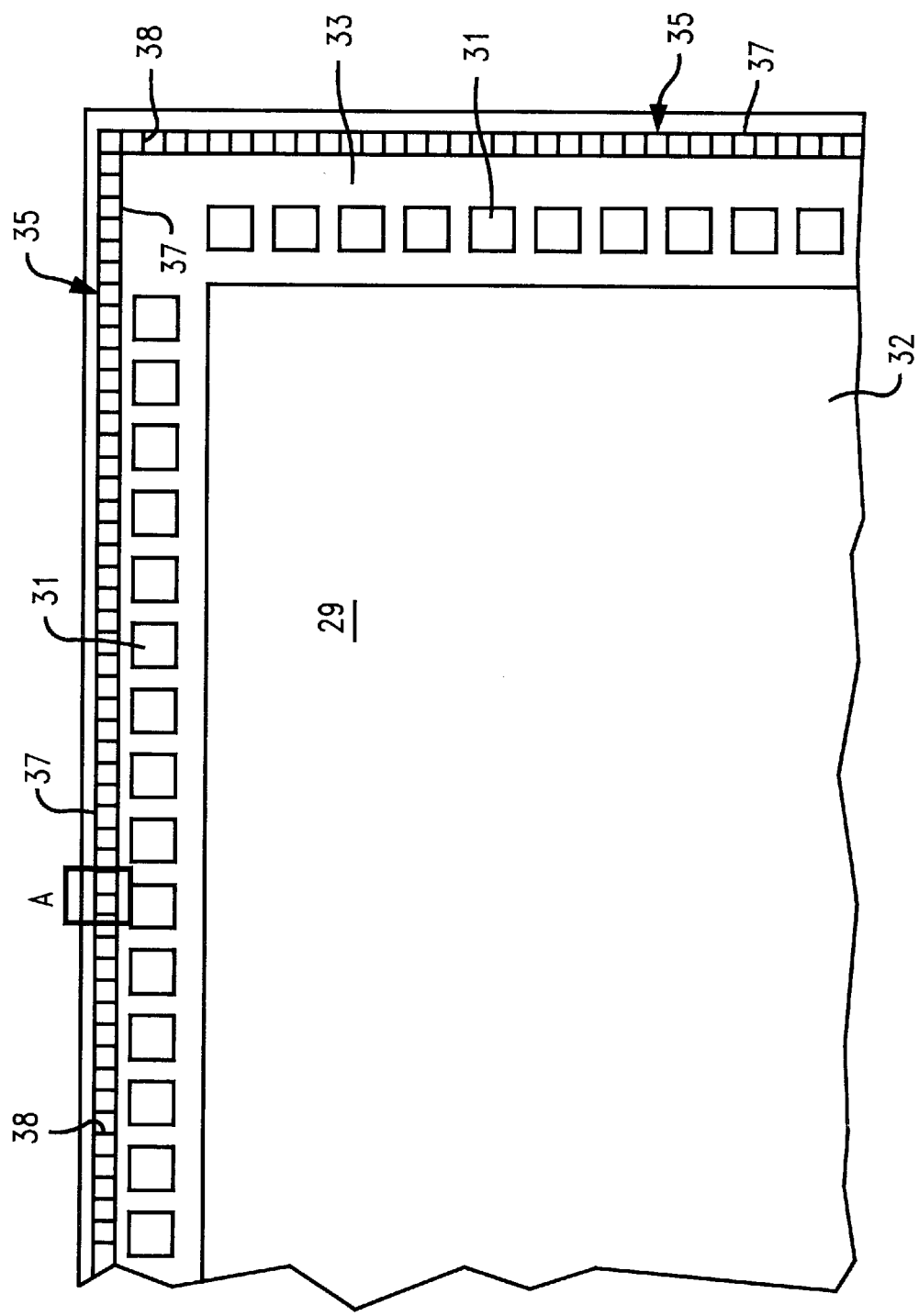
FIG. 2 shows a top view of a corner area of a device with wire bond pads.

FIG. 2 shows a partial top view of a semiconductor chip 29 employing wire bond pads 31 around the periphery for I/O interconnection to and from active device region 32. Also shown in the peripheral region 33 exterior to the pads, is the mesh-like reinforcing interconnection structure 35, in accordance with the present invention. As shown, the interconnection structure comprises bridged metal lines 37 extending around the periphery of the chip 29 exterior to pads 31. Metal lines 37 are bridged by metal lines 38. This line structure is repeated at lower levels and the various levels are interconnected by conductive vias. It should be noted that the drawings shown herein are not to scale but are merely provided to facilitate an understanding of the invention.

The reinforcing interconnection structure 35, shown in FIG. 2, is in reality, not on the same surface as wiring pads 31 but is rather at the device uppermost wiring level and each level below. Dimensionally, the interconnecting lines at these levels could be between 0.5 and 1.5 microns. In this regard, it is noted that the metallurgy dimensions at the first level of metallurgy may be as small as 0.1 microns or less. As the multilayer structure is built up, the metallurgy dimensions increase somewhat so that at four levels of metallurgy, for example, the dimensions may typically be in the range of 0.5 to 2.0 microns. Since the reinforcing interconnection structure of the present invention is fabricated at the same time as the device metallurgy is fabricated, the interconnection structure will, thus, have the same general dimensions.

Figure 3:
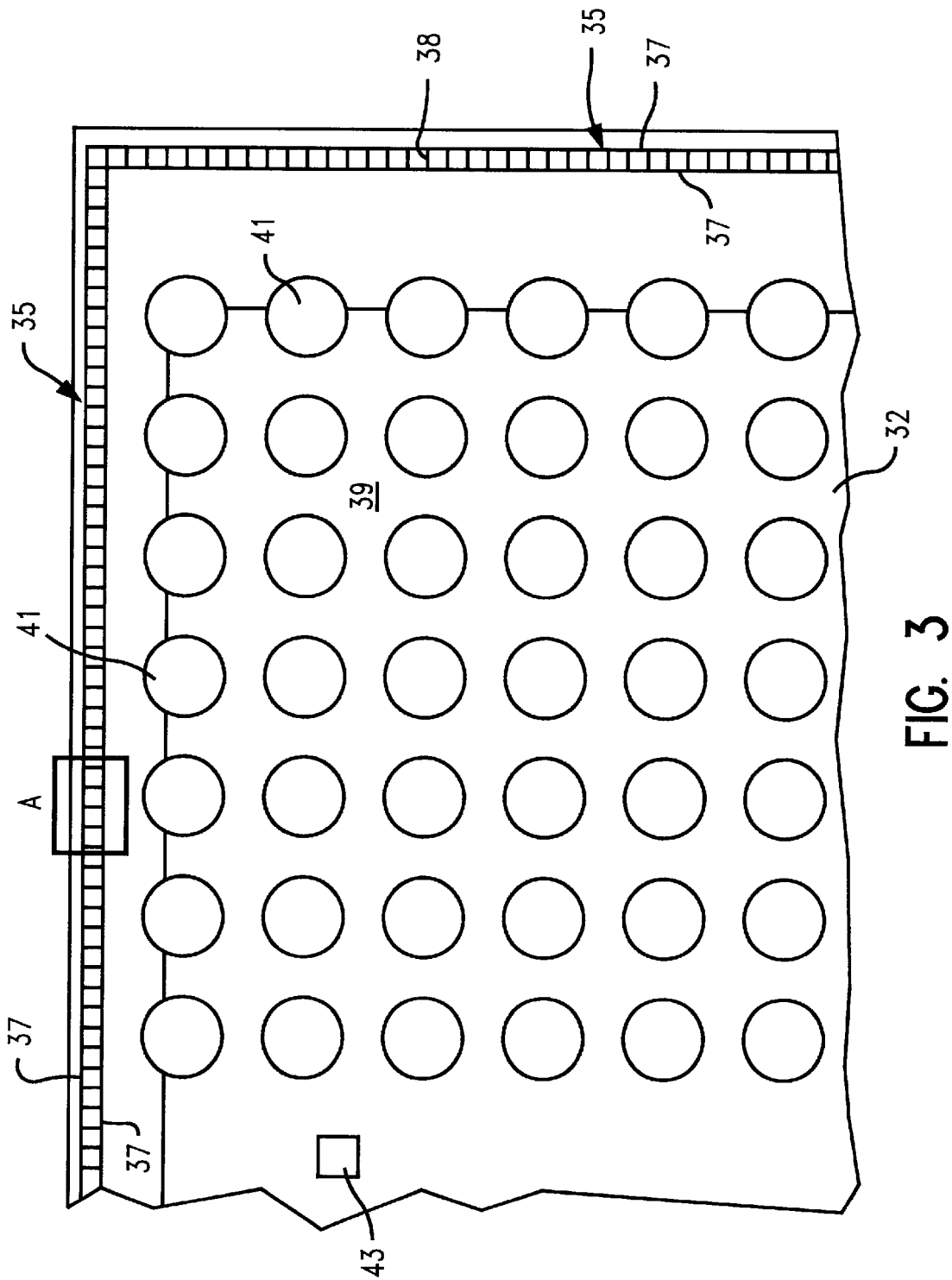
FIG. 3 shows a top view of a corner area of a device with flip chip solder bumps.

FIG. 3 shows a partial top view of a semiconductor chip 39 employing flip chip connections, such as C-4 solder ball connections 41. The reinforcing interconnection structure 35 is the same as shown in FIG. 2. It should be understood that, in accordance with the present invention, the reinforcing interconnection structure may be positioned in any region of the chip that may be susceptible to delamination and such regions, more than likely, will be chip regions where there is little active device structure. For example, as shown in FIG. 3, region 43 within active device region 32 could contain a limited reinforcing interconnection structure extending to the lower levels to thereby inhibit delamination in that region.

Figure 4:
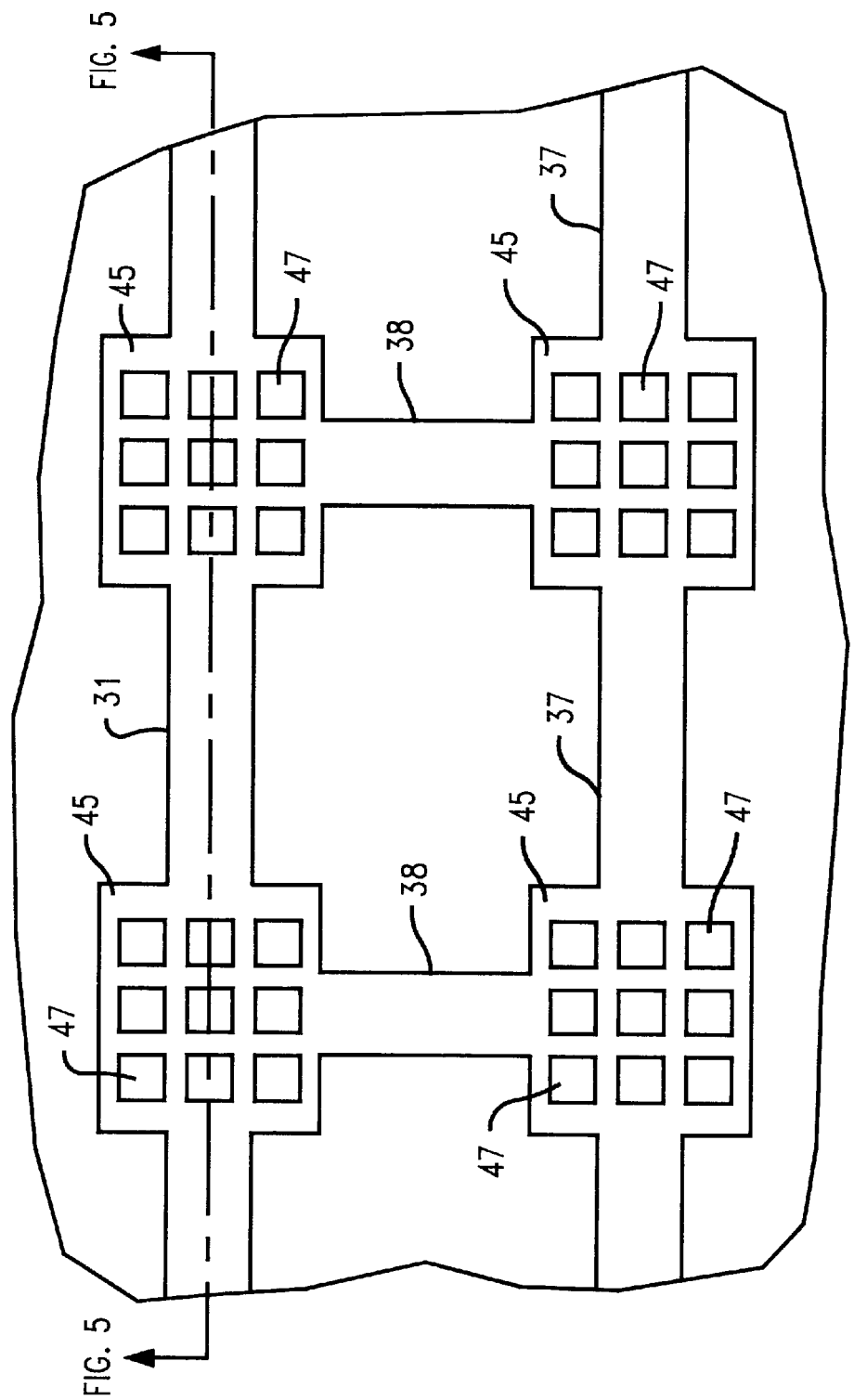
FIG. 4 shows a magnified top view of an area designated A in the top views of FIGS. 2 and 3.

FIG. 4 shows an enlarge top view of the area designated A in the top views of FIGS. 2 and 3. As shown, the reinforcing interconnection structure comprises two lines or rows of metal pads 45 bridged by sections of metal lines 37 with adjacent pads bridged by metal lines 38. An array of nine metal filled vias 47 is arranged beneath, and in conductive contact with, each metal pad. Each of the metal filled vias 47 connects at its lower end to a similar pad arrangement at the next lowest level of metallurgy. The pads of the next lowest level of metallurgy are similarly interconnected, as are the pads shown in FIG. 4. It is clear that although nine metal filled vias 47 are shown, a different number may as readily be employed, depending upon the top area dimensions of the vias and pads. Similarly, the metal filled vias 47 are shown from the top to be square but could take other shapes. Typically, the vias as shown at this pad level would be around 0.5 microns in width and square pads 45 would be around 2.5 to 4.0 microns in width. The widths of lines 37 and 38 could be in the range of 0.5 to 2.0 microns.

Thus, it can be seen that the vias are substantially smaller in cross sectional area than the area of the pads, "substantially" meaning, for example, one fifth to one eighth smaller. The larger pad areas provide vertical strength when connected to the vias thereby acting to mechanically hold the layers together. However, the dimensions and relationship of dimensions given above are not critical as long as they are sufficient to provide the required vertical and horizontal mechanical strength to inhibit delamination and cracking.

It should be clear that more than two lines or rows of pads may be employed, and different metal line or row interconnection patterns may, likewise, be employed. For example, the metal pads in the two rows may be offset from one another and bridged by diagonally arranged metal lines. Other arrangements are possible to provide the required lateral reinforcement of the mesh-like reinforcement structure of the present invention.

Figure 5:
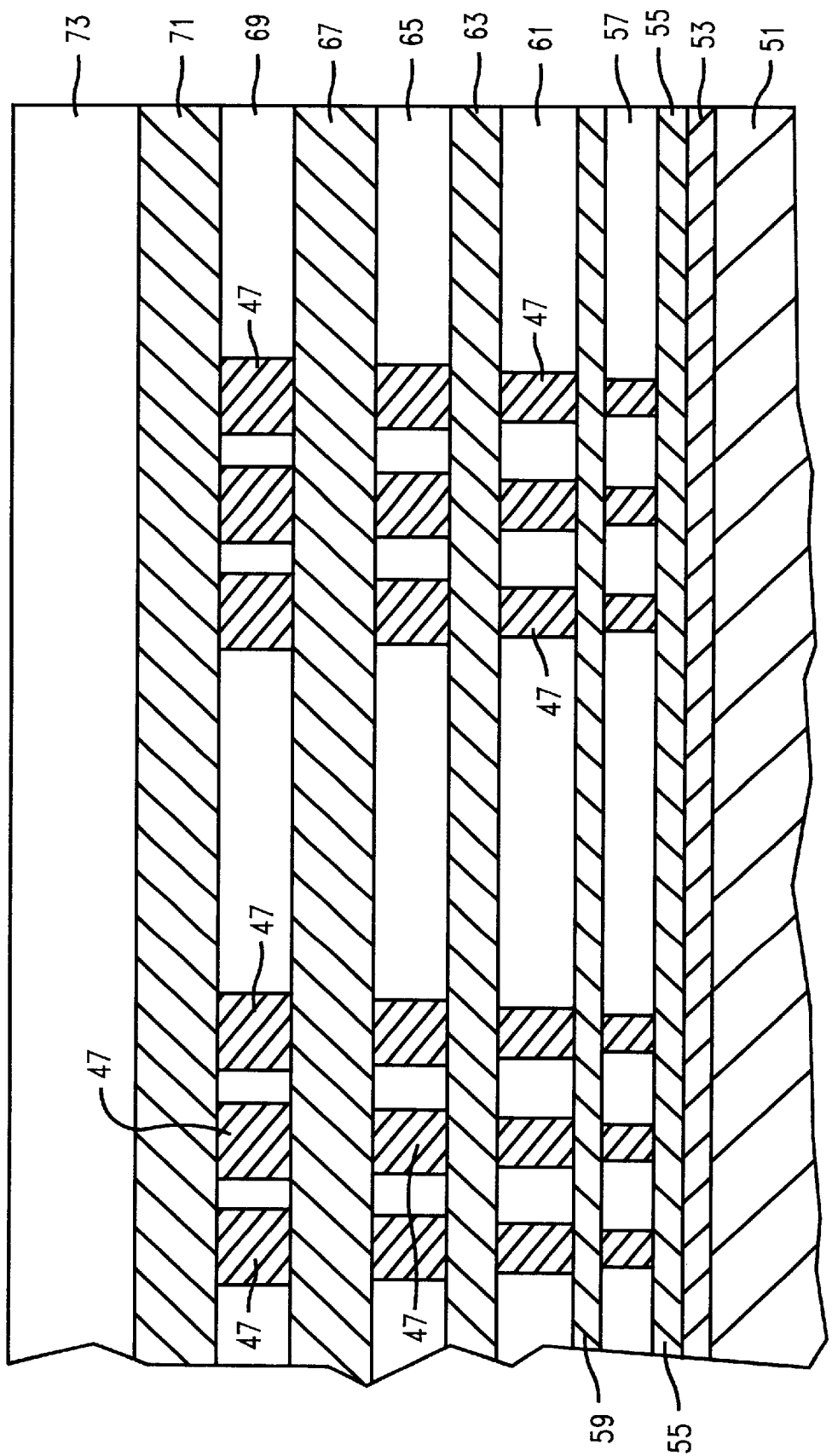
FIG. 5 is a schematic of a cross-section of the arrangement shown in FIG. 4.

FIG. 5 shows a cross-section of the arrangement shown in FIG. 4, taken along the line designated FIG. 5. The multi-layer structure extends upwardly from substrate 51. Protective layer 53 covers the active device regions in the substrate and typically would comprise a borophosphosilicate glass (BPSG) material, the two layers comprising the fabrication processes at the front end of the line (FEOL).

As shown in FIG. 5, wiring level 55 comprises the first wiring level of the BEOL wiring level integration manufacturing process. Typically, an oxide insulating layer 57 is deposited upon wiring level 55 but this insulating layer could also be a low-k dielectric insulating layer upon wiring level 55. Thereafter, the second wiring level 59 is deposited upon oxide material 57 and it, in turn, has a low-k dielectric material 61 deposited thereon. Layers 63 and 67 respectively comprise the third and fourth wiring levels with low-k dielectric layers 65 and 69 respectively deposited thereon. The final metal layer 71 comprises the metal lines 37 and 38 and metal pads 45 of the reinforcing interconnection structure shown in FIG. 4. Layer 73 is the final silicon oxide or silicon nitride passivation layer.

As further shown in FIG. 5, vias 47 interconnect the various layers of metallurgy, anchoring one to the other from the top layer of interconnecting metal lines 37 and 38 and interconnecting metal pads 45, as shown in FIGS. 2–4, to the first layer of metallization 55. It can be seen, consistent with the rules of lithography, that the metal filled vias 47 and layers of metal become progressively larger as the layers build up. It should be understood that the multilayer reinforcing interconnection structure, as shown in FIGS. 2–5, is electrically isolated from the active device metallurgy. However, it can also be used as part of the active device structure. For example, the three dimensional mesh-like structure of layers of bridged lines and pads interconnected from one level to the next by an array of vias could be used as a shielding mechanism around the chip active regions. Alternatively, the mesh-like structure could be used as a grounding plane.

For device integrity, the conductive vias 47 which act as anchors from one layer to another layer, should begin at the uppermost wiring level and end at any wiring level formed in an insulating material exhibiting interfacial adhesion exceeding that of the intervening layers of low-k organic dielectric material. Thus, as shown in FIG. 5, vias 45 extend from the pads and interconnecting metal layer 71 and extend to the metal layer 55 of wiring level 1 which is adhered to BSPG layer 53.

Since the use of low-k dielectric materials is necessitated by the need to employ copper wiring in current semiconductor device technology, the reinforcing interconnection structure is similarly made of copper. The copper pads, as shown in FIG. 4, bridged by copper lines 37 and 38 give horizontal mechanical integrity to the reinforcement structure. The copper vias 47 shown in FIG. 5, along with the pads 45, give vertical mechanical integrity to the reinforcement structure. It should be understood, however, that the mechanical integrity provided by the mesh-like reinforcement structure, in accordance with the present invention, could be used with different types of metallurgy and different types of insulating material.

Figure 6:
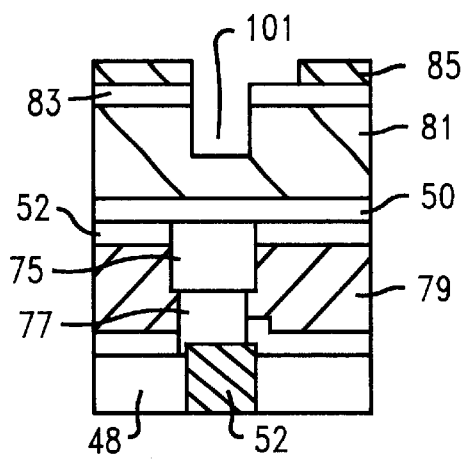
FIGS. 6A to 6H shows partial cross-sectional views of a semiconductor device, illustrating a method of BEOL manufacturing wherein the reinforcing structure in accordance with the present invention may be made as the device is manufacture.
Figure 6:
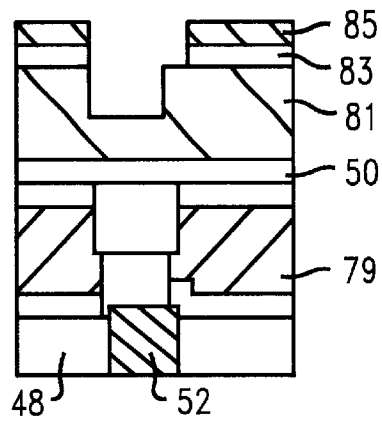
Figure 6:
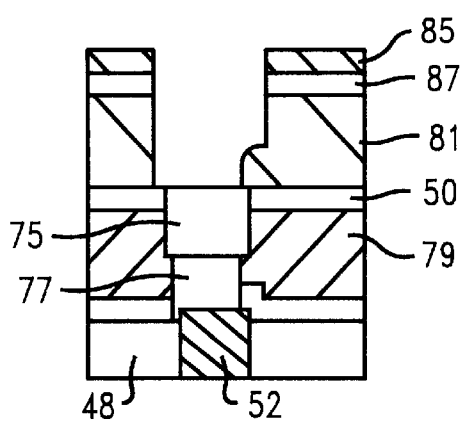
Figure 6:
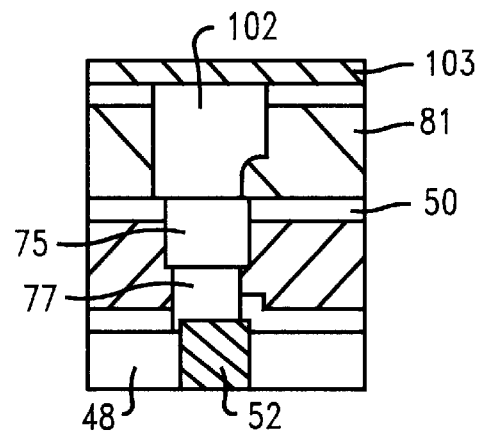

FIGS. 6A through 6H show one process that may be employed to fabricate copper-based semiconductor devices using low-k dielectric materials. FIG. 6A shows an oxide layer 48 which covers the device region in an underlying semiconductor substrate (not shown). Metal layer 52, which is typically tungsten, makes contact to the underlying devices, such as transistors. The first level of copper metallization, which form copper line 75, is reached from device tungsten contact 52 through copper-filled via 77. Low-k dielectric material layer 79, deposited on hard cap 78, surrounds this copper. This dielectric may be applied by spin coating, for example SiLK™. Hard cap layer 50 is deposited upon copper 75 and low-k dielectric layer 79 with underlying hard mask layer 52 open to copper metallization 75. Low-k dielectric layer 81 spun coated on hard cap 50 which is, in turn, covered by hard mask layers 83 and 85. Anti-reflective layer 87 is applied to hard mask 85 and is, in turn, covered with a layer of photo resist 89.

The arrangement in FIG. 6A is then exposed and developed and an etch pattern is formed. Thereafter, the pattern is etched through hard mask 85 to form opening 9 1, as shown in FIG. 6B. Another anti-reflective coating 93 is then applied along with a resist layer 95 which is exposed and developed to form an opening 97, as shown in FIG. 6C. An opening is then etched through anti-reflective layer 93 and hard mask 83 to form a via image opening 99, as shown in FIG. 6D.

After forming the via image opening 99, a via 101 is partially etched in low-k dielectric layer 8 1, as shown in FIG. 6E. Hard mask 83 is then etched back to be coextensive in opening with hard mask 85 as shown in FIG. 6F. The etching of low-k dielectric layer 81 is then completed, as shown in FIG. 6G. The opening in layer 81 is then cleaned and filled with copper to form a copper filled via and line 102 connected to copper metallization level 75 and copper-filled via 77.

Before filling the opening or trench in layer 81 with copper, a liner material of metal may be used. Filling the trench with copper may be achieved by first placing a seed layer of copper on top of the trench liner. The seed layer may be deposited by CVD or PVD. Then, the bulk copper to fill the trench is electroplated onto the seed layer. Overplated copper material is then removed by chemical mechanical polishing (CMP). Finally, cap material 103 such as silicon nitride, is deposited over copper filled via 102 and hard mask 87.

There is thus described a process for forming the copper multilayer reinforcing interconnection structure simultaneous with the BEOL wiring level integration process. The process described shows the manner in which the second wiring level is formed and integrated with the first wiring level. It is clear that his same process could be repeatedly used to form and integrate additional wiring levels, as for example, forming and integrating wiring levels 1 through 4 or more. Thus at each wiring level, the rows or lines of copper pads bridged by copper lines to each other an to adjacent pads in adjacent rows can readily be formed. Likewise, at each wiring level, copper filled vias are formed to the copper pads below. Thus, in such example, the copper filled vias of the reinforcing structure would extend from the interconnecting lines and pads of the reinforcement structure at the highest wiring level down through the layers to anchor the layers at the tungsten contact 52.

It is clear that the three dimensional network reinforcing structure could take different forms but such forms should link together in a matrix structure as described to provide the physical integrity to mechanically inhibit delamination and cracking.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A semiconductor device, comprising:
a semiconductor substrate having an active device region and a passive region with multiple wiring levels separated by layers of insulating material extending therefrom to an uppermost wiring level of said semiconductor device and with at least some of said multiple wiring levels separated by low-k dielectric insulating material;
a conductive pad formed at said uppermost wiring level in said passive region and at each successive wiring level therebeneath to at least the lowest of said wiring levels that is deposited upon other than a layer of low-k dielectric insulating material; and
at least one conductive via having a cross-sectional area substantially smaller than the area of said conductive pad in contact with and arranged between the said conductive pad of said uppermost wiring level and the said conductive pad of the next lower wiring level and thence between each conductive pad at each said successive wiring level therebeneath to the said at least lowest of said wiring levels.

2. The semiconductor device as set forth in claim 1 wherein said at least one conductive via comprises a plurality of vias between each of said pads on each of said successive wiring levels.

3. The semiconductor device as set forth in claim 2 wherein said conductive pads and conductive vias include copper.

4. The semiconductor device in claim 3 wherein there are a plurality of conductive pads interconnected by conductive lines at each successive wiring levels to the said at least the lowest wiring level with each of said plurality of conductive pads interconnected at successive layers by its own said plurality of conductive vias to thereby form a mesh-like structure.

5. The semiconductor device as set forth in claim 4 wherein said mesh-like structure is arranged in said passive region extending around the periphery of said active device region.

6. The semiconductor device as set forth in claim 5 wherein said mesh-like structure includes at least two lines of conductive pads around said periphery with each successive pad in each line conductively connected to the next conductive pad in said line and with each said pad in each line conductively connected to the closest pad in an adjacent line.

7. The semiconductor device as set forth in claim 6 wherein said mesh-like structure forms a shielding arrangement around said active device region.

8. A semiconductor device, comprising:
a semiconductor substrate having an active device region and a passive region with multiple wiring levels extending therefrom to an uppermost wiring level of said semiconductor device and with at least some of said multiple wiring levels separated by low-k dielectric insulating material;
a plurality of conductive pads formed at said uppermost wiring level and at each successive wiring level therebeneath to at least the lowest of said wiring levels that is deposited upon other than a layer of low-k dielectric insulating material, said plurality of pads at each wiring level interconnected to one another by conductive lines; and
a plurality of conductive vias in contact with and arranged between each of said plurality of pads beginning at said uppermost wiring level and each of said conductive pads at the next lower wiring level and thence between each of the said plurality of conductive pads at each successive said wiring level therebeneath to the said at least lowest of said wiring levels.

9. The semiconductor device as set forth in claim 8 wherein the sum of the cross-sectional areas of said plurality of vias in contact with each pad is substantially less than the cross-sectional area of said pad.

10. The semiconductor device as set forth in claim 9 wherein said conductive pads and conductive vias include copper.

11. The semiconductor device in claim 10 wherein each pad of said plurality of conductive pads at said uppermost wiring level and at each successive wiring level to the said at least the lowest wiring level are interconnected to one another at its own wiring level to thereby form a mesh-like structure.

12. The semiconductor device as set forth in claim 11 wherein said mesh-like structure is formed in said passive region extending around the periphery of said active device region.

13. The semiconductor device as set forth in claim 12 wherein said mesh-like structure includes at least two lines of conductive pads extending around said periphery with each successive pad in each line conductively connected to the next conductive pad in said line and with each said pad in each line conductively connected to the closest pad in an adjacent line.

* * * * *